United States Patent
Subramanian et al.

(10) Patent No.: US 6,605,546 B1
(45) Date of Patent: Aug. 12, 2003

(54) DUAL BAKE FOR BARC FILL WITHOUT VOIDS

(75) Inventors: Ramkumar Subramanian, Sunnyvale, CA (US); Wolfram Grundke, Dresden (DE); Bhanwar Singh, Morgan Hill, CA (US); Christopher F. Lyons, Fremont, CA (US); Marina V. Plat, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 132 days.

(21) Appl. No.: 09/901,699

(22) Filed: Jul. 11, 2001

(51) Int. Cl.[7] .............................................. H01L 21/302
(52) U.S. Cl. ........................ 438/725; 430/5; 438/714; 438/692; 438/694; 438/697; 438/705; 438/734; 438/723; 438/740; 134/1.2
(58) Field of Search ............................... 430/5; 438/725, 438/714, 692, 694, 697, 705, 734, 723, 740; 134/1.2, 1.3

(56) References Cited

U.S. PATENT DOCUMENTS

| | | | |
|---|---|---|---|
| 5,516,625 A | * | 5/1996 | McNamara et al. ........ 430/314 |
| 5,705,430 A | * | 1/1998 | Avanzino et al. ........... 437/195 |
| 5,965,461 A | | 10/1999 | Yang et al. |
| 6,211,061 B1 | * | 4/2001 | Chen et al. ................... 438/622 |
| 6,323,123 B1 | * | 11/2001 | Liu et al. ..................... 438/638 |
| 6,372,616 B1 | * | 4/2002 | Yoo et al. .................... 438/592 |
| 6,406,995 B1 | * | 6/2002 | Hussein et al. .............. 438/638 |

* cited by examiner

*Primary Examiner*—George Goudreau
(74) *Attorney, Agent, or Firm*—Foley & Lardner

(57) ABSTRACT

A method for forming a semiconductor device comprises forming a first layer over a semiconductor substrate. At least one hole is formed through the first layer. A bottom anti-reflective coating (BARC) layer is formed in the at least one hole. A first heating is performed to heat the BARC layer to a flow temperature. A second heating is performed to heat the BARC layer to a hardening temperature so that the BARC layer hardens, wherein the hardening temperature is greater than the flow temperature. An etch is performed to form a trench in the first layer and over the at least one hole, wherein the hardened BARC layer in the at least one hole acts as an etch resistant layer during the etch. As an alternative to the second heating step, the BARC may be simply hardened. The first and second heating may be performed within a heating chamber without removing the semiconductor substrate.

49 Claims, 6 Drawing Sheets

Heat at Temperature = $T_f$

Heat at Temperature = $T_h$

DUAL BAKE FOR BARC FILL WITHOUT VOIDS

CROSS-REFERENCE TO RELATED APPLICATIONS

This application is related to the following applications:
1. Ser. No. 09/901,702 entitled "MEASURING BARC THICKNESS USING SCATTEROMETRY".
2. Ser. No. 09/901,704 entitled "E-BEAM FLOOD EXPOSURE OF SPIN-ON MATERIAL TO ELIMINATE VOIDS IN VIAS".
3. Ser. No. 09/901,701 entitled "E-BEAM SENSITIVE MATERIAL TO CONTROL VIA FILL DEPTH".

BACKGROUND OF THE INVENTION

1. Field of the Invention

This invention relates generally to the elimination of possible voiding of etch resistant material in vias in semiconductor device fabrication. In particular, this invention relates to the elimination of voiding of spin-on bottom anti-reflection coating (BARC) material in vias using a dual bake in semiconductor device fabrication.

2. Description of the Related Art

In certain processes of making semiconductor devices, a via or hole is etched through an insulating dielectric layer to expose an underlying layer, and the insulating dielectric layer is then etched again to form a wider trench above the via or contact hole. For example, in a via first dual inlaid dual damascene process, via holes are first etched, and then overlying trenches connecting respective via holes are formed in an inter-level dielectric (ILD). The trenches and vias are then filled with a conductive material that connects to underlying conducting material on the device through the via holes. In this process a via hole is first etched in a hole formation etch, and then exposed to a second etch in the trench formation etch. In this case, the second etch exposes any layer exposed by the hole to the etchant in the second etch.

SUMMARY OF THE INVENTION

According to an embodiment of the present invention there is provided a method for forming a semiconductor device. The method comprises forming a first layer over a semiconductor substrate. At least one hole is formed through the first layer. A bottom anti-reflective coating (BARC) layer is formed in the at least one hole. A first heating is performed to heat the BARC layer to a flow temperature. A second heating is performed to heat the BARC layer to a hardening temperature so that the BARC layer hardens, wherein the hardening temperature is greater than the flow temperature. An etch is performed to form a trench in the first layer and over the at least one hole, wherein the hardened BARC layer in the at least one hole acts as an etch resistant layer during the etch.

According to another embodiment of the present invention there is provided a method for forming a semiconductor device. The method comprises forming a first layer over a semiconductor substrate. A first etch is performed to form a plurality of holes through the first layer. A bottom anti-reflective coating (BARC) layer is formed over the first layer and in the plurality of holes. The BARC layer is heated to a flow temperature so that the BARC layer flows to fill any voids present in the plurality of holes. The BARC layer is hardened after heating the BARC layer to a flow temperature. A second etch is performed to form a trench in the first layer and over the at least one hole, wherein the hardened BARC layer in the at least one hole acts as an etch resistant layer during the second etch.

According to another embodiment of the present invention there is provided a method for forming a semiconductor device. The method comprises forming a first layer over a semiconductor substrate. At least one hole is formed through the first layer. A bottom anti-reflective coating (BARC) layer is formed in the at least one hole. The semiconductor substrate is placed in a heating chamber. A first heating is performed within the heating chamber to heat the BARC layer to a flow temperature. A second heating is performed within the heating chamber to heat the BARC layer to a hardening temperature so that the BARC layer hardens, wherein the hardening temperature is greater than the flow temperature, wherein the first heating and the second heating are performed in the heating chamber without removing the semiconductor substrate. An etch is performed to form a trench in the first layer and over the at least one hole, wherein the hardened BARC layer in the at least one hole acts as an etch resistant layer during the etch.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

Figure 1A:
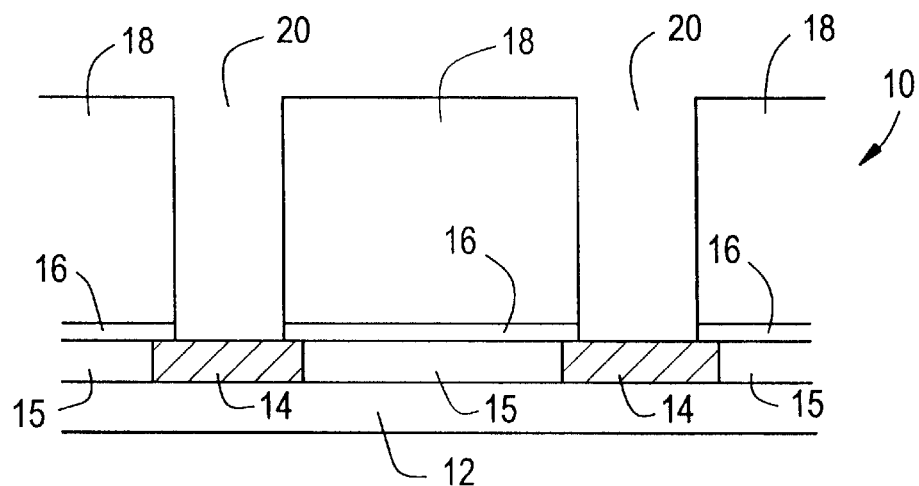
FIGS. 1A–1H illustrate cross-sectional views of the structure of a semiconductor device according to an embodiment of a process of the present invention.

FIG. 1A shows a structure formed in the first steps of a process in an embodiment of the invention of forming a semiconductor device 10. In FIG. 1A, the semiconductor device 10 includes a semiconductor substrate 12. The substrate may comprise, for example, a IV—IV material such as silicon, germanium, or an alloy of silicon and germanium. The substrate may alternatively comprise a III–V material such as GaAs, AlAs, etc. or a II–VI material such as CdS etc.

A conducting layer 14 is formed over the semiconductor substrate 12. The conducting layer 14 may be a patterned wiring layer comprising a conducting material, as is known in the art. The conducting layer may comprise, for example, a doped semiconductor material or a metal. Suitable metals include copper, tungsten, aluminum, and alloys thereof. The conducting layer 14 may also comprise a silicide such as a refractory metal silicide. Suitable refractory metal silicides include titanium silicide, tungsten silicide, nickel silicide, and cobalt silicide.

The conducting layer 14 may be formed by any suitable process, such as chemical vapor deposition (CVD), plasma enhanced chemical vapor deposition (PECVD), plating, or sputtering.

The conducting layer 14 may be formed, for example, by blanket deposition of conducting material followed by either etch-back or polishing to remove undesired conducting material. Alternatively, the conducting layer 14 may be formed by selective deposition of conducting material. If the conducting layer 14 is formed by selective deposition, it may be desirable to first form a lining material that acts as an adhesion promoter or nucleation material.

Although the conducting layer 14 is shown in FIG. 1A to be an interconnect, the conducting layer 14 may alternatively be a region of the semiconductor substrate 12, such as a doped region of the substrate 12. The conducting layer 14 may be, for example, a p-type or n-type region of the semiconductor substrate 12.

An ILD layer 15 is formed between regions of conducting layer 14 as shown in FIG. 1A. The ILD layer 15 may be, for example, a low-k dielectric to reduce capacitance between conducting regions of the semiconductor device 10 shown in FIG. 1A. By reducing the capacitance between conducting regions, the low-k dielectric reduces the interline capacitance, thereby reducing the RC delay, cross-talk noise and power dissipation in the interconnects. In this application low-k dielectric means a dielectric with a dielectric constant of less than about 4. Suitable low-k dielectrics are, for example, benzocyclobutene (BCB), hydrogen silsequioxane (HSQ), FLARE, which is a commercially known material manufactured by Allied Signal, and SILK.

After the conducting layer 14 and ILD layer 15 are formed, a cap layer 16 may optionally be formed to protect the conducting layer 14 by acting as a barrier layer. The cap layer 16 may also be chosen to act as an adhesion promoter for subsequent layers to be formed on the cap layer 16. The cap layer 16 may be, for example, silicon nitride (SiN) when the first conducting layer is copper. The silicon nitride may be deposited, for example, by chemical vapor deposition (CVD). If the first conducting layer is aluminum, the cap layer 16 may be SiN or $SiO_2$.

After the conducting layer 14 is formed, a first layer 18 is formed over the semiconductor substrate 12 and the conducting layer 14. The first layer 18 may be an insulating layer to provide insulation between different levels of conductive wiring.

The first layer 18 may be an ILD. The first layer 18, like the ILD 15, may be, for example, a low-k dielectric to reduce capacitance between conducting regions of the semiconductor device 10 shown in FIG. 1A.

After the first layer 18 has been formed, holes 20, such as via or contact holes, are formed in the first layer 18 in a first etching. While FIG. 1A shows two holes, a single hole or more than two holes may be formed. The holes 20 may be formed by known techniques, such as forming an etch mask on the first layer 18, dry etching to form the holes 20, and subsequently removing the etch mask. The dry etching may be reactive ion etching (RIE), for example.

The holes 20 shown in FIG. 1A expose the conducting layer 14. Thus, the first etching may include etching through the cap layer 16, if a cap layer is present. Alternatively, the holes 20 may be formed such that they do not expose the conducting layer 14 in the first etching, but expose the conducting layer 14 only upon a subsequent etching after a trench over the holes is formed. The trench etching process is described later.

Figure 1B:
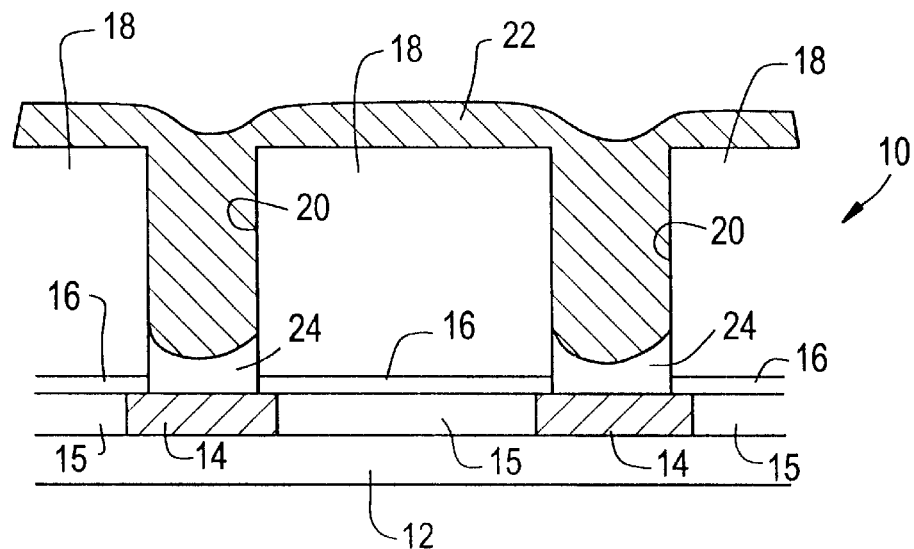

As shown in FIG. 1B, after the holes 20 are formed in the first etching, a bottom anti-reflective coating (BARC) layer 22 is formed filling the holes 20. It should be noted that although BARC layer 22 has anti-reflective properties, the BARC layer 22 need not be actually used as an anti-reflective coating in subsequent processing. However, the BARC layer 22 should have etch resistant properties in the subsequent trench etch, described later. The BARC layer 22 is preferably a conventional spin-on organic material, such as, for example, polyimides, polysulfones, and/or the like, that forms a thin film. Specifically, the BARC may be, for example, KrF17G2 from AZ-CLARIANT or AR7 made by Shipley. Organic materials such as these and techniques for applying them in thin films are well known to those skilled in the art.

The BARC layer 22 may be formed by a spinning on process as is known in the art. A BARC solution is first spun on over the first layer 18, and then a soft bake is performed to drive off the BARC solution leaving the BARC layer 22. When the BARC layer 22 is formed on the first layer 18, the BARC layer 22 is also formed in the holes 20. It is possible, however, that the process of forming the BARC layer 22 causes voids 24 to be formed in the holes 20, such that the BARC layer 22 does not completely fill the holes 20.

Because there is a possibility of voids being formed in the holes 20 during the formation of the BARC layer 22, the BARC layer 22 should be heated such that the BARC layer reaches a flow temperature. When a flow temperature is reached the BARC layer 22 will flow filling the voids 24.

Figure 1C:
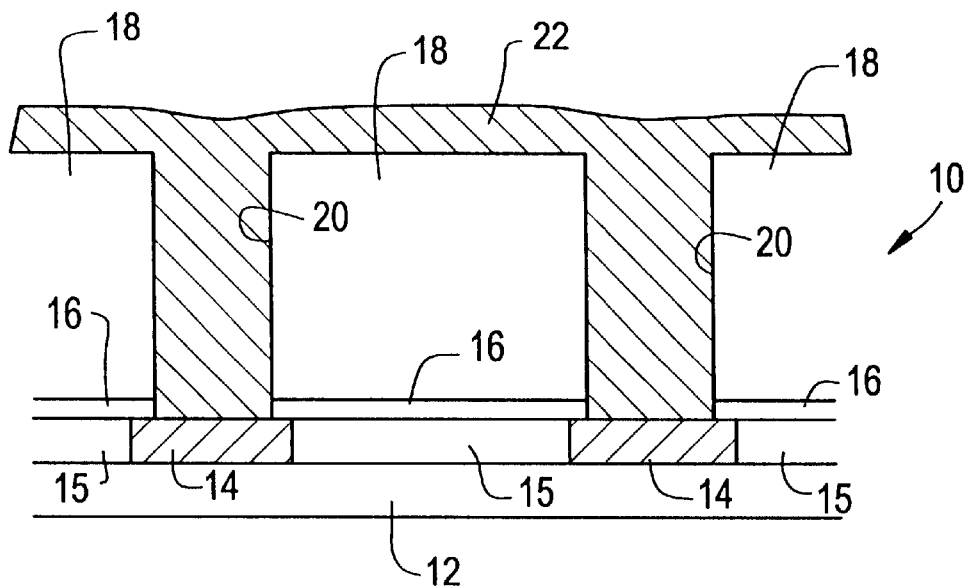

FIG. 1C shows heating the semiconductor device 10 structure, after the BARC layer 22 is formed, to a flow temperature to fill any potential voids 24 in the holes 20. In general, the flow temperature will be the glass transition temperature, Tg, of the BARC layer 22. In this first heating step the BARC layer 22 should be heated at a temperature sufficient to cause the BARC layer to fill any potential voids, but at a temperature lower than the temperature at which the BARC layer will harden. For example, in the first heating step, the BARC layer 22 may be heated to a temperature in the range of 120 to 180° C. The specific temperature range will depend upon the particular BARC material employed.

The BARC layer 22 may be heated by directing electromagnetic radiation, such as infra-red (IR) radiation to the BARC layer 22. For example, the BARC layer 22 may be heated by a lamp or a laser. The electromagnetic radiation may be directed directly on the BARC layer 22. Alternatively, the entire semiconductor device 10 may be heated. For example, the substrate 12 may be placed on a susceptor which is inductively heated to heat the semiconductor device 10. As shown in FIG. 1C, in this first heating step, the heating causes the BARC layer 22 to flow and eliminate any voids. Beneficially, heating the BARC layer 22 above the flow temperature also planarizes the BARC layer 22.

Figure 1D:
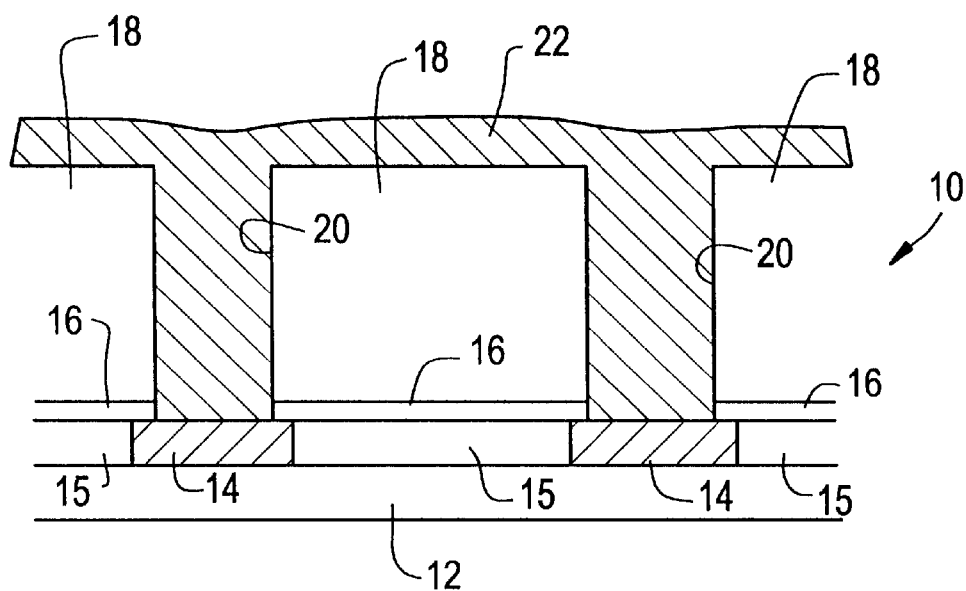

FIG. 1D shows a second heating step to harden the BARC layer 22. The second heating step should be performed after the first heating step, i.e., the BARC layer 22 should first be heated to cause the BARC layer 22 to flow and eliminate any potential voids in the holes 20. After the voids are filled, the BARC layer is heated in the second heating step to harden the BARC layer to increase its etch resistance during a subsequent trench etch, described later. The temperature of the second heating step will generally be larger than the temperature of the first heating step. For example, in the second heating step, the BARC layer 22 may be heated to a temperature in the range of 150 to 230° C. The specific temperature range will depend upon the particular BARC material employed.

The BARC layer 22 may be heated in this second heating step in a similar fashion to the first step. For example, in this second heating step, the BARC layer may be heated by directing electromagnetic radiation, such as infra-red (IR) radiation to the BARC layer 22. For example, in this second heating step, the BARC layer 22 may be heated by a lamp or a laser. The electromagnetic radiation may be directed directly on the BARC layer 22. Alternatively, the entire semiconductor device 10 may be heated. For example, the substrate 12 may be placed on a susceptor which is heated to heat the semiconductor device 10.

Alternatively to the second heating step, the BARC 22 may be hardened using ion implantation, or exposure to a plasma or ultra-violet (UV) radiation. For example, the BARC 22 may be implanted with inert ions, such as Ar ions to harden the BARC. In this alternative method of hardening the BARC 22, the BARC may also be simultaneously heated. The heating of the BARC may be caused, in part, by the ion implantation, exposure to plasma or UV radiation. Alternatively, a heat source other than the ions, plasma or UV radiation may be employed.

The top portion of the BARC layer 22 that is on top of the first layer 18 may, if desired, be substantially removed so that the BARC layer 22 does not inhibit formation of a trench in further processing, described later. For example, the top portion of the BARC layer 22 may be substantially removed to substantially expose the top of the first layer 18 by an etch back process, or polishing. The etch back process may be an ashing step where the BARC layer 22 is exposed to oxygen for a time sufficient to substantially remove the top portion of the BARC layer 22. The polishing may be chemical mechanical polishing, for example.

Figure 1E:
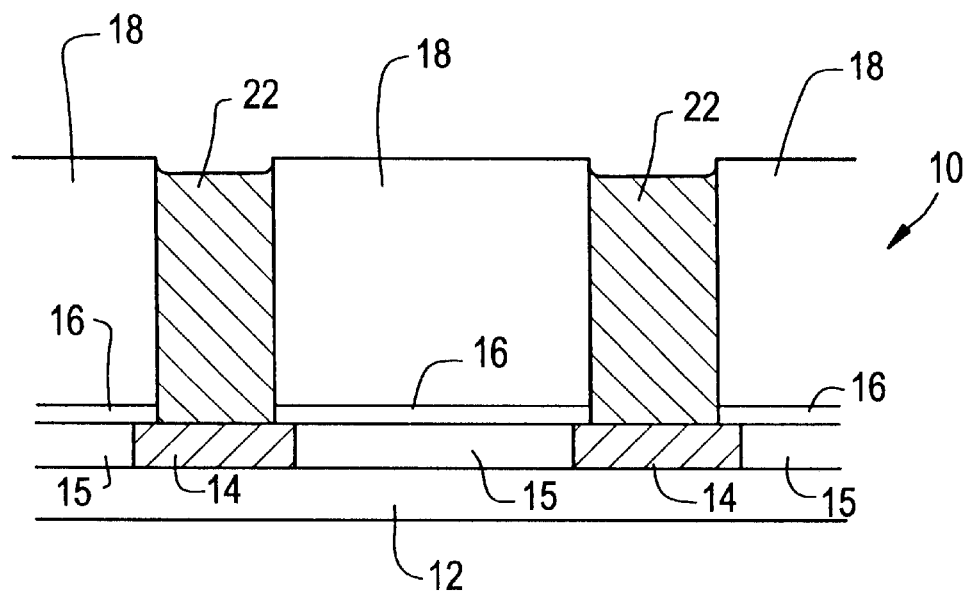

In FIG. 1E the BARC layer 22 is slightly recessed relative to the top of the first layer 18. Alternatively, the BARC layer 22 may extend slightly above the first layer or be level with the top of the first layer 18.

Figure 1F:
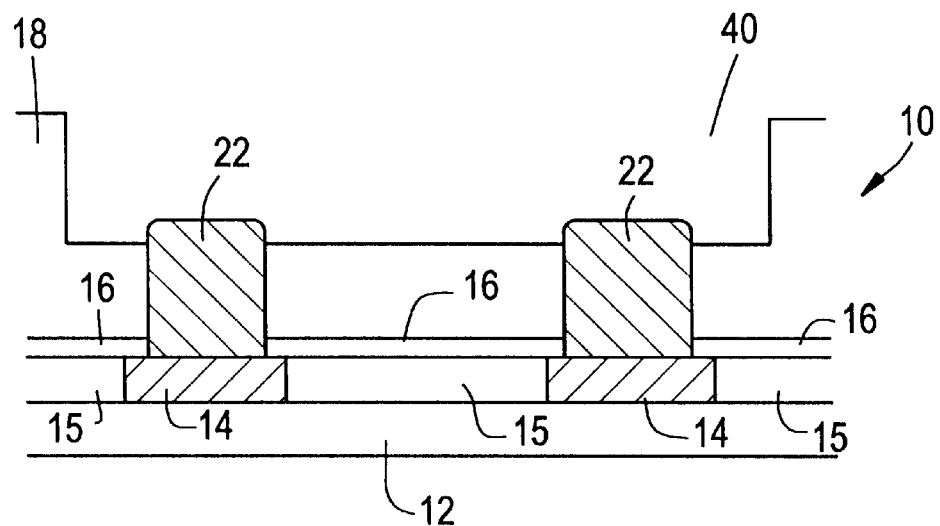

FIG. 1F illustrates the process of forming a trench 40 over the holes 20. The trench 40 is formed by etching the first layer 18 over the holes 20. The etching to form the trench 40 may be performed using a dry etch, such as a plasma etch or reactive ion etching (RIE). A resist mask (not shown) with the trench pattern is formed over first layer 18, and the trench is etched through the mask as is known in the art.

Beneficially, the BARC layer 22 that remains in the holes 20 acts as an etch resistant material during the etch of the trench 40. Thus, the underlying conducting layer 14 is protected during the etch of the trench 40.

FIG. 1F shows the remaining BARC layer 22 extending outside the holes 20. However, the remaining BARC layer 22 need not extend out of the holes to provide etch protection for the underlying conducting layer 14. In fact, there may be no BARC layer 22 remaining after the trench etch. It is preferred, however, that the BARC 22 remain in the hole at least during most of the trench etch to protect the underlying conducting layer 14.

FIG. 1F shows the trench 40 etched such that the holes 20 are connected by the trench 40. Alternatively, the holes 20 may not be connected by the trench 40.

Figure 2:
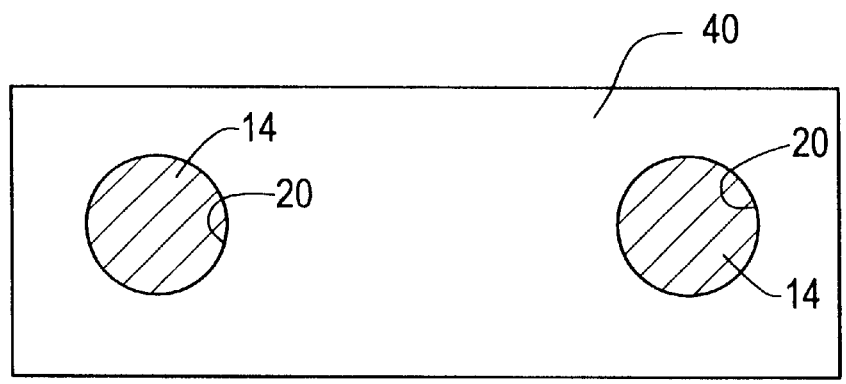
FIG. 2 is a top view of the structure of FIG. 1F.

FIG. 2 shows a top view of the trench 40 and the holes 20 of the structure of FIG. 1F. The trench 40 is seen to have a rectangular cross-section. Alternatively, the trench 40 may have other than a rectangular cross-section. For example, the trench 40 may have a circular cross-section where the axis of the trench 40 is co-linear with the axis of one of the holes 20. Thus, the trench 40 may be simply a wider hole above one of the holes 20.

Figure 1G:
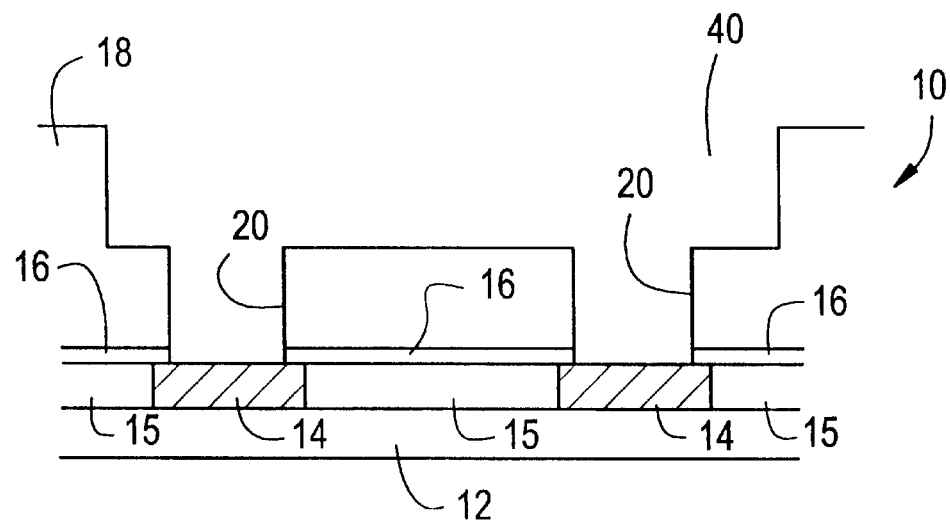

As shown in FIG. 1G, after the trench 40 is formed, the portion of the BARC 22 that remains is removed to expose the underlying conducting layer 14. The remaining BARC 22 may be removed, for example, by ashing the BARC through exposure to an oxygen plasma, or by exposing the BARC 22 to a wet stripping solution. Once the remaining portion of the BARC is removed, further processing continues.

Figure 1H:
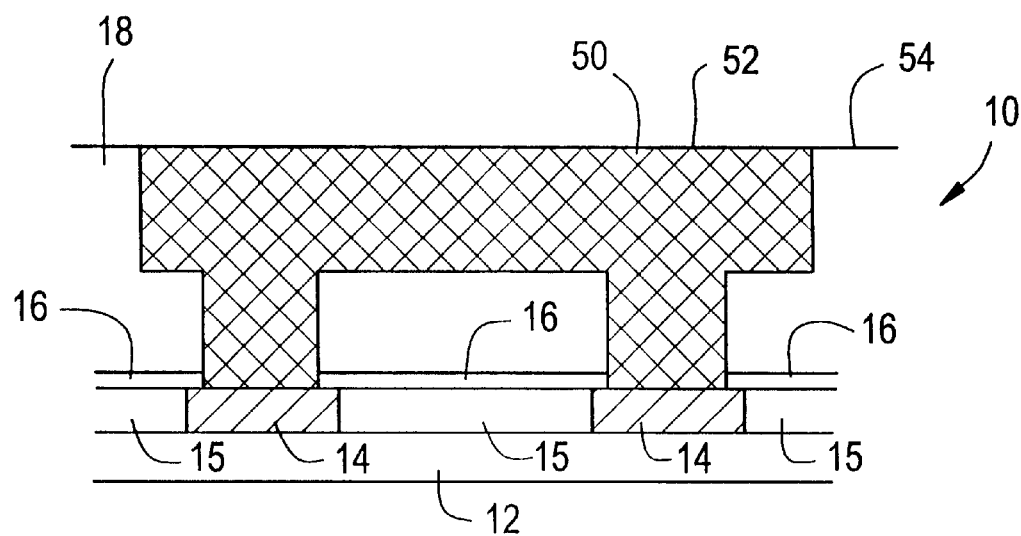

As shown in FIG. 1H, after the BARC layer 22 is removed, a second conducting layer 50 may be formed in the trench 40 and holes 20 to connect to the conducting layer 14. The second conducting layer 50 may be formed, for example, by blanket depositing a second conducting material over the substrate 12 and in the trench 40 and holes 20, followed by removing a top portion of the second conducting layer until a top surface 52 of the second conducting layer 50 is substantially at a same height as a top surface 54 of the first layer 18. The top portion of the second conducting layer 50 may be removed, for example, by etching back or polishing the second conducting layer 50. The polishing of the second conducting layer 50 may be performed by chemical mechanical polishing, for example.

Although the process illustrated in FIGS. 1A–1H is a dual damascene process, the present invention is not so limited.

Figure 3:
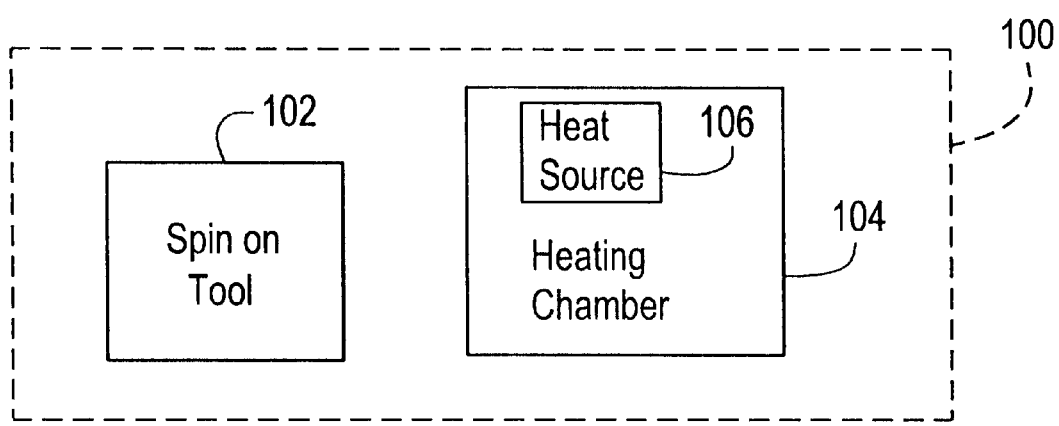
FIG. 3 is a schematic of the apparatus used to perform an embodiment of a method of the present invention.

FIG. 3 is a schematic of an apparatus 100 for spinning on and heating the BARC layer. The apparatus includes a spin on tool 102 and a heating chamber 104. In general, the apparatus will comprise other tools, such as a developer (not shown), for example. The apparatus 100 is contained within a single track, where the single track includes both the spin on tool 102 and heating chamber 104. The track is a tool that is used to coat, bake and develop photoresist. The track comprises a set of individual chambers such that a robot may take the semiconductor substrate from chamber to chamber, where the individual process operations are performed. The heating chamber 104 includes a heating source 106 to provide heat to the BARC layer. After the BARC layer is spun-on in the spin-on tool 102, the semiconductor substrate is transferred to and placed in the heating chamber 104. The spin-on tool 102 may be any spin-on tool known in the art which is appropriate for spinning on a BARC layer.

Preferably, the heating steps to flow and to harden the BARC layer, described above with respect to FIGS. 1C and 1D, respectively, are both performed in the single heating chamber 104 without removing the semiconductor substrate between heating steps. By performing both heating steps in the same heating chamber without removing the substrate, exposing the substrate to unnecessary mechanical forces can be avoided.

The heating chamber 104 is preferably a rapid thermal processing (RTP) system. Beneficially, RTP systems allow for rapid thermal ramp up and ramp down in temperature. With the rapid thermal ramp up and ramp down, the processing time for a particular thermal treatment can be decreased. The heating chamber may include an infra-red (IR) lamp as the heating source 106, for example, to allow for rapid thermal ramp up and ramp down.

Figure 4:
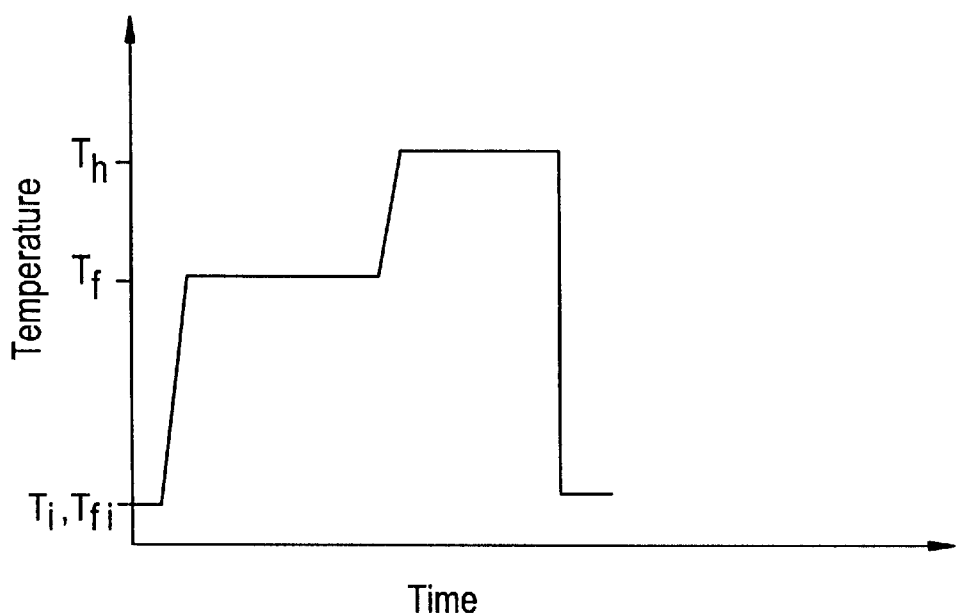
FIG. 4 is a diagram showing a temperature scheme according to an embodiment of the invention.

FIG. 4 illustrates a particular heat treatment scheme for heating the BARC layer to flow into the holes, and then heating the BARC layer to harden the BARC. After the BARC layer is placed in the heating chamber 104, the temperature is ramped up from an initial temperature $T_i$, to a temperature $T_f$ where the BARC layer will flow. In general, the temperature $T_f$ chosen may be any temperature where the BARC layer flows, but does not harden. Thus, in general $T_f$ should be at least the glass transition temperature $T_g$ of the BARC layer. Once the temperature is ramped up to the temperature $T_f$, the temperature is maintained at $T_f$ for a time sufficient for the BARC layer to flow and fill the holes.

The temperature is then ramped up again in a second ramp up to a temperature $T_h$ at which the BARC layer will harden.

The temperature is maintained at the temperature $T_h$ for a time sufficient for the BARC layer to harden. The temperature $T_h$ should be high enough to cause the BARC layer to harden, but not so high as to damage the BARC layer. Thus, in general, the temperature $T_h$ may be chosen from a range of appropriate temperatures.

Once the BARC layer is hardened as desired at the temperature $T_h$, the temperature $T_h$ may be ramped down to a final temperature, $T_f$, and the substrate may be removed from the heating chamber 104. The final temperature $T_f$ is lower than both the flow temperature $T_f$ and the hardening temperature $T_h$. In FIG. 4, the final temperature $T_f$ is the same as the initial temperature $T_i$. However, the initial and final temperatures may be different.

FIG. 4 illustrates both the flow heating step and the hardening heating step performed at constant temperatures. However, the flow heating step may be performed at a varying temperature. Of course the flow heating step should still be performed at a temperature sufficient to cause the BARC to flow, but lower than a hardening temperature. Likewise the hardening heating step may be performed at a varying temperature. Of course the hardening heating step should still be performed at a temperature sufficient to cause the BARC to harden, but lower than a temperature that will cause damage to the BARC layer.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of forming a semiconductor device comprising:
    forming a first layer over a semiconductor substrate;
    forming at least one hole through the first layer;
    forming a bottom anti-reflective coating (BARC) layer in the at least one hole;
    performing a first heating to heat the BARC layer to a flow temperature;
    performing a second heating to heat the BARC layer to a hardening temperature so that the BARC layer hardens, wherein the hardening temperature is greater than the flow temperature; and
    performing an etch to form a trench in the first layer and over the at least one hole, wherein the hardened BARC layer in the at least one hole acts as an etch resistant layer during the etch.

2. The method of claim 1, wherein the first layer is an interlevel dielectric layer (ILD).

3. The method of claim 2, wherein the ILD is a low-k dielectric layer.

4. The method of claim 3, wherein the ILD is one of benzocyclobutene (BCB), hydrogen silsequioxane (HSQ), FLARE, and SILK.

5. The method of claim 1, wherein said etch is a second etch, the step of forming is a first etch, and the first etch exposes a conducting layer.

6. The method of claim 5, wherein the first etch etches through a cap layer between the conducting layer and the first layer.

7. The method of claim 6, wherein the cap layer is one of $SiO_2$ and SiN.

8. The method of claim 5, wherein the conducting layer comprises one of an aluminum layer, an aluminum alloy layer, a tungsten layer, a tungsten alloy layer, a copper layer, and a copper alloy layer.

9. The method of claim 8, wherein the conducting layer comprises a copper layer.

10. The method of claim 1, wherein the exposing step is performed to flow said BARC layer so as to eliminate voids in said at least one hole.

11. The method of claim 1, wherein the BARC layer is an organic material.

12. The method of claim 1, wherein the at least one hole comprises a first hole and a second hole, and the trench connects the first hole to the second hole.

13. The method of claim 12, wherein the method comprises a dual damascene process.

14. The method of claim 1, wherein the at least one hole comprises a first hole, the trench and the first hole have a substantially circular cross section, and an axis of the trench is co-linear with an axis of the first hole.

15. The method of claim 1, wherein said etch is a second etch, the step of forming is a first etch, and the first and second etches are dry etches.

16. The method of claim 1, further comprising:
    forming a BARC layer over the first layer simultaneously with forming the BARC layer in said at least one hole; and
    substantially removing the BARC layer from a top of the first layer after the first heating step by one of polishing and etching back the BARC layer.

17. The method of claim 5 further comprising:
    removing the BARC layer from the at least one hole after the second etch step.

18. The method of claim 17, wherein the removing step is performed by one of dry etching and wet etching the BARC layer in the at least one hole.

19. The method of claim 18, wherein the removing step is performed by dry etching and the dry etching ashes the BARC layer in an oxygen atmosphere.

20. The method of claim 17, further comprising:
    forming a conducting layer in the trench and the at least one hole after the removing step.

21. The method of claim 1, wherein the BARC layer comprises an organic material, the first heating step is performed in the temperature range of 120 to 180° C., and the second heating step is performed in the temperature range of 150 to 230° C., wherein the temperature of the second heating step is greater than the temperature of the first heating step.

22. A method of forming a semiconductor device comprising:
    forming a first layer over a semiconductor substrate;
    performing a first etch to form a plurality of holes through the first layer;
    forming a bottom anti-reflective coating (BARC) layer over the first layer and in the plurality of holes;
    heating the BARC layer to a flow temperature so that the BARC layer flows to fill any voids present in the plurality of holes;
    hardening the BARC layer after heating the BARC layer to a flow temperature; and performing a second etch to form a trench in the first layer and over the at least one hole, wherein the hardened BARC layer in the at least one hole acts as an etch resistant layer during the second etch.

23. The method of claim 22, wherein the hardening step comprises subjecting the BARC layer to one of ion implanting, exposure to a plasma, and exposure to ultraviolet (UV) radiation.

24. The method of claim 23, wherein the BARC layer is simultaneously heated during the hardening step.

25. A method of forming a semiconductor device comprising:
   forming a first layer over a semiconductor substrate;
   forming at least one hole through the first layer;
   forming a bottom anti-reflective coating (BARC) layer in the at least one hole;
   placing the semiconductor substrate in a heating chamber;
   performing a first heating within the heating chamber to heat the BARC layer to a flow temperature;
   performing a second heating within the heating chamber to heat the BARC layer to a hardening temperature so that the BARC layer hardens, wherein the hardening temperature is greater than the flow temperature, wherein the first heating and the second heating are performed in the heating chamber without removing the semiconductor substrate; and
   performing an etch to form a trench in the first layer and over the at least one hole, wherein the hardened BARC layer in the at least one hole acts as an etch resistant layer during the etch.

26. The method of claim 25, wherein forming the BARC layer step comprises:
   placing the semiconductor substrate in a spin-on tool;
   spinning on the BARC layer.

27. The method of claim 26, wherein the spin-on tool and the heating chamber are in a single track.

28. The method of claim 25, wherein the first heating step comprises ramping up to a first temperature at which the BARC layer will flow and maintaining the first temperature for a time sufficient for the BARC layer to fill the at least one hole, and the second heating step comprises ramping up to a second temperature at which the BARC layer will harden and maintaining the second temperature for a time sufficient for the BARC layer to harden, wherein the second temperature is greater than the first temperature.

29. The method of claim 28 wherein the first and second temperatures are constant.

30. The method of claim 28 wherein the first and second temperatures vary within respective ranges.

31. The method of claim 25, wherein the BARC layer comprises an organic material, the first temperature is in the range of 120 to 180° C., and the second temperature is in the range of 150 to 230° C.

32. The method of claim 28, further comprising: ramping down to a third temperature lower than both the first and second temperatures to cool the BARC layer after the second heating step.

33. The method of claim 25, wherein the heating chamber is a rapid thermal processing (RTP) system.

34. The method of claim 25, wherein the heating chamber includes an infra-red source that heats the BARC layer during the first and second heating steps.

35. The method of claim 25, wherein the first layer is an interlevel dielectric layer (ILD).

36. The method of claim 25, wherein said etch is a second etch, the step of forming is a first etch, and the fir etch exposes a conducting layer.

37. The method of claim 36, wherein the conducting layer comprises one of an aluminum layer, an aluminum alloy layer, a tungsten layer, a tungsten alloy layer, a copper layer, and a copper alloy layer.

38. The method of claim 37, wherein the conducting layer comprises a copper layer.

39. The method of claim 36, wherein the conducting layer comprises a doped semiconductor layer.

40. The method of claim 25, wherein the BARC layer is an organic material.

41. The method of claim 25, wherein the at least one hole comprises a first hole and a second hole, and the trench connects the first hole to the second hole.

42. The method of claim 41, wherein the method comprises a dual damascene process.

43. The method of claim 25, wherein the at least one hole comprises a first hole, the trench and the first hole have a substantially circular cross section, and an axis of the trench is co-linear with an axis of the first hole.

44. The method of claim 25 wherein said etch is a second etch, the step of forming is a first etch, and the first and second etches are dry etches.

45. The method of claim 25, further comprising:
   substantially removing the BARC layer from a top of the first layer after the second heating step by one of polishing and etching back the BARC layer.

46. The method of claim 25, further comprising:
   removing the BARC layer from the at least one hole after said etch.

47. The method of claim 46, wherein the removing step is performed by one of dry etching and wet etching the BARC layer in the at least one hole.

48. The method of claim 47, wherein the removing step is performed by dry etching and the dry etching ashes the BARC layer in an oxygen atmosphere.

49. The method of claim 46, further comprising:
   forming a conducting layer in the trench and the at least one hole after the removing step.

* * * * *